(12) United States Patent
Hwang et al.

(10) Patent No.: US 11,387,584 B1
(45) Date of Patent: Jul. 12, 2022

(54) CONTACT PIN FOR TESTING SEMICONDUCTOR IC FOR HIGH SPEED SIGNAL, SPRING CONTACT INCLUDING SAME, AND SOCKET DEVICE

(71) Applicants: HICON CO., LTD., Seongnam (KR); Dong Weon Hwang, Seongnam (KR); Logan Jae Hwang, Flower Mound, TX (US); Jae Baek Hwang, Seoul (KR)

(72) Inventors: Dong Weon Hwang, Seongnam (KR); Logan Jae Hwang, Flower Mound, TX (US); Jae Baek Hwang, Seoul (KR)

( * ) Notice: Subject to any disclaimer, the term of this patent is extended or adjusted under 35 U.S.C. 154(b) by 0 days.

(21) Appl. No.: 17/190,454

(22) Filed: Mar. 3, 2021

(30) Foreign Application Priority Data

Dec. 31, 2020 (KR) .................. 10-2020-0189613

(51) Int. Cl.
*H01R 13/17* (2006.01)
*H01R 13/422* (2006.01)
*H01R 13/24* (2006.01)

(52) U.S. Cl.
CPC ......... *H01R 13/17* (2013.01); *H01R 13/2421* (2013.01); *H01R 13/2435* (2013.01); *H01R 13/422* (2013.01); *H01R 13/2485* (2013.01)

(58) Field of Classification Search
CPC .. H01R 13/17; H01R 13/422; H01R 13/2421; H01R 13/2435; H01R 13/2485
See application file for complete search history.

(56) References Cited

U.S. PATENT DOCUMENTS

| 7,626,408 | B1 | 12/2009 | Kaashoek | |
| 8,523,579 | B2 * | 9/2013 | Johnston | H01R 13/2421 |
| | | | | 439/66 |
| 2008/0180125 | A1 | 7/2008 | Lee | |
| 2009/0146672 | A1 | 6/2009 | Nakamura | |
| 2011/0175636 | A1 * | 7/2011 | Swart | H01R 13/2421 |
| | | | | 324/755.05 |
| 2012/0042509 | A1 | 2/2012 | Takeya | |
| 2015/0377925 | A1 | 12/2015 | Hwang et al. | |
| 2016/0216294 | A1 | 7/2016 | Kaashoek | |
| 2017/0074903 | A1 | 3/2017 | Teranishi et al. | |

FOREIGN PATENT DOCUMENTS

| KR | 101288519 B1 | 7/2013 |
| KR | 101436194 B1 | 9/2014 |
| KR | 10145768 B1 | 10/2014 |
| KR | 101678146 B1 | 11/2016 |
| KR | 10-2055773 B1 | 12/2019 |
| KR | 1020190142956 A | 12/2019 |
| TW | 200831907 A | 8/2008 |

(Continued)

*Primary Examiner* — Travis S Chambers

(57) ABSTRACT

A contact pin, a spring contact including the same, and a socket device are proposed, in which the contact pin has a minimum length suitable for testing a semiconductor IC for a high speed signal and allows the spring contact to secure a maximum compression distance. The contact pin (100) includes: a plate-shaped body part (110) having a width and a thickness; a head part (120) configured to be integrated with an upper end of the body part (110); and a leg part (130) formed by extending from a lower end of the body part (110) to be integrated therewith, wherein the head part (120) is a plate-shaped strip (122) provided on the upper end of the body part (110).

22 Claims, 21 Drawing Sheets

(56) References Cited

FOREIGN PATENT DOCUMENTS

| | | |
|---|---|---|
| TW | 201305567 A1 | 2/2013 |
| TW | 201310038 A1 | 3/2013 |
| TW | 201534924 A | 9/2015 |
| TW | 201732297 A | 9/2017 |
| TW | 201932845 A | 8/2019 |
| WO | 2012173777 A3 | 12/2012 |
| WO | 2015126064 A1 | 8/2015 |
| WO | 2019141716 A1 | 7/2019 |

* cited by examiner

CONTACT PIN FOR TESTING SEMICONDUCTOR IC FOR HIGH SPEED SIGNAL, SPRING CONTACT INCLUDING SAME, AND SOCKET DEVICE

CROSS REFERENCE TO RELATED APPLICATION

The present application claims priority to Korean Patent Application No. 10-2020-0189613, filed Dec. 31, 2020, the entire contents of which is incorporated herein for all purposes by this reference.

BACKGROUND OF THE INVENTION

Field of the Invention

The present disclosure relates generally to a contact pin for testing a semiconductor IC, a spring contact including the same, and a socket device. More particularly, the present disclosure relates to a contact pin, a spring contact including the same, and a socket device, in which the contact pin has a minimum length suitable for testing a semiconductor IC for a high speed signal and allows the spring contact to secure a maximum compression distance.

Description of the Related Art

Generally, in the manufacturing process of a semiconductor IC, various tests are performed to check whether the semiconductor IC is defective. As one of the tests of the semiconductor IC, there is an electrical characteristic test of the semiconductor IC. Such a test of the semiconductor IC is performed through a socket device that electrically connects the semiconductor IC and a wiring board such as a test board (PCB) to each other.

Generally, the socket device includes a contact electrically connected to a terminal of the semiconductor IC by corresponding thereto, the contact being an essential component of the socket device that tests the semiconductor IC.

Generally, for reliable contact of the contact with a contact point (a terminal), sufficient pressing force is required to applied to the contact. Accordingly, the contact is required to have sufficient elasticity within a predetermined range. In addition, in order to minimize the electrical resistance of the contact, it is desirable to shorten the length of the contact. Various types of contacts meeting these conditions are available.

Meanwhile, recently, various semiconductor ICs have been developed to process high-speed signals for 5G and 6G communication. A contact for performing the function test or real time burn-in test of a semiconductor IC for such high speed signals (about 40 GHz or more) is also required to be developed to be suitable for test signals of high speed signals.

Length of the contact is required to be about 1.0 mm to process a high speed signal of about 40 GHz. However, it is difficult to manufacture a conventional contact such as a pogo pin such that the conventional contact structurally has length of 1.0 mm or less.

Accordingly, in the present application, "a contact pin suitable for testing a semiconductor IC for a high speed signal, a spring contact including the same, and a socket device" is proposed, in which the length of the spring contact can be manufactured to 1.0 mm or less by improving "spring contact and socket with the spring contact" disclosed in Korean Patent No. 10-2055773 (published on Dec. 13, 2019) by the present applicant.

Document of Related Art (Patent Document 1) Korean Patent No. 10-2055773 (published on Dec. 13, 2019)

SUMMARY OF THE INVENTION

Accordingly, the present disclosure has been made keeping in mind the above problems occurring in the related art, and the present disclosure is intended to propose a contact pin having minimum length suitable for testing a semiconductor IC for a high speed signal, a spring contact including the same, and a socket device.

In order to achieve the above objective, according to one aspect of the present disclosure, there is provided a contact pin for a spring contact, the contact pin including: a plate-shaped body part having a predetermined width and a predetermined thickness; a head part configured to be integrated with an upper end of the body part; and a leg part formed by extending from a lower end of the body part to be integrated therewith, wherein the head part is a plate-shaped strip provided on the upper end of the body part, wherein the strip has the same length at each of opposite sides of the body part relative thereto and has an upper tip part formed along an upper end of the strip, the strip including: a first strip section provided to be located on the same plane as a plane of the body part and to have the same distance from a center of the body part to each of the opposite sides thereof, and a second strip section formed by being rolled at each of opposite end parts of the first strip section to have a semicircular shape, wherein the first strip section is located in a diameter direction of a cylindrical shape formed by an entirety of the second strip sections; the body part has a groove formed at the center of each of opposite surfaces of the body part by being recessed in a longitudinal direction of the body part, wherein a stepped holding step is formed on a lower end part of the groove, and an upper end of the groove is formed to be open by extending up to an upper end of the first strip section; and the leg part is configured as a pair of leg parts formed by extending from the body part such that the leg parts have a first width therebetween and are horizontally symmetrical to each other, wherein each of the leg parts comprises: a hook protrusion formed by protruding inward from each of end parts of the leg parts, the hook protrusions having a second width therebetween smaller than the first width; and a lower tip part formed by protruding from a lower end of the leg part.

Preferably, a thickness of an end of the upper tip part may be smaller than a thickness of the strip of the head part.

Preferably, opposite corners at which the body part and the head part are in contact with each other may be formed concavely inward.

Preferably, a chamfered inclined surface having an inclination may be formed in a thickness direction of the body part on each edge of the lower end of the body part adjacent to an area between the leg parts.

Preferably, the hook protrusion may have an inclined surface in an opening direction thereof.

Preferably, a thickness of the hook protrusion may be smaller than the thickness of the body part.

Preferably, the lower tip part may have a thickness smaller than a thickness of the hook protrusion.

Preferably, the first width between the leg parts may be larger than the thickness of the body part.

Preferably, the second width between the hook protrusions may be smaller than the thickness of the body part and may be the same as or larger than a thickness of the body part located in a section in which the groove is formed.

Preferably, the contact pin may further include: a connection tap formed on the upper end of the first strip section such that the connection tap protrudes lower than the upper tip part, and more preferably, the connection tap may have a through hole formed concavely, and may be configured as a pair of connection taps at opposite sides of the through hole relative thereto.

A spring contact according to the one aspect of the present disclosure including the contact pin described above, the contact pin being configured as a first contact pin and a second contact pin, the spring contact may include: a coil spring elastically supporting the first contact pin and the second contact pin while a leg part of the first contact pin and a leg part of the second contact pin intersect orthogonally with each other and are supported by a head part of the second contact pin and a head part of the first contact pin, respectively.

Preferably, an entire length of the spring contact may be the same as a sum of lengths of the head parts of the first contact pin and the second contact pin and of a length of the coil spring.

A spring contact according to another aspect of the present disclosure including the contact pin described above, the contact pin being configured as a first contact pin, the spring contact may include: a coil spring having an end supported by a head part of the first contact pin, and a second contact pin elastically supported by the coil spring and intersecting orthogonally with the first contact pin, wherein the second contact pin may include: a second plate-shaped body part having a predetermined width and a predetermined thickness; a pair of shoulder parts formed by protruding from opposite side ends of the second body part and supporting an end of the coil spring; a second head part having a second upper tip part formed by protruding upward therefrom and configured to be integrated with an upper end of the second body part on the same plane as a plane of the upper end of the body part; and a second leg part formed by extending integrally from a lower end of the second body part and being assembled with a leg part of the first contact pin by intersecting with the leg part of the first contact pin, wherein the second body part may have a second groove formed by being recessed in a longitudinal direction thereof at a center of each of opposite surfaces thereof, wherein a stepped second holding step may be formed at a lower end part of the second groove, and an upper end of the second groove may be formed to be open by extending up to an upper end of the second head part, and the second leg part may be configured as a pair of second leg parts formed by extending from the body part such that the second leg parts have a first width therebetween and are horizontally symmetrical to each other, wherein each of the second leg parts may include: a second hook protrusion formed by protruding inward from each of end parts of the second leg parts, the second hook protrusions having a second width therebetween smaller than the first width; and a second lower tip part formed by protruding from a lower end of the second leg part.

Preferably, an entire length of the spring contact may be the same as a sum of the length of the head part of the first contact pin, a length from a second upper tip part of the second contact pin to a lower end of a shoulder part thereof, and the length of the coil spring.

Preferably, a length of the first contact pin and a length of the second contact pin may be the same.

Next, a socket device for testing a semiconductor IC according to still another aspect of the present disclosure, the socket device including the spring contact described above, the socket device may include: an elastic socket body part having a receiving hole formed therethrough, the receiving hole allowing the spring contact to be inserted therethrough and to be received therein; a mounting plate mounted to the socket body part and having a mounting guide hole formed therethrough such that the mounting plate is mounted to a precise position of the socket body part; an elastic upper film plate having a first through hole formed therethrough and attached to an upper surface of the socket body part, wherein the first through hole corresponds to the receiving hole; and a lower film plate attached to a lower side of the mounting plate and having a second through hole and a third through hole formed therethrough, the second through hole and the third through hole corresponding to the receiving hole and the mounting guide hole, respectively.

Preferably, each of the mounting plate and the lower film plate additionally may have a mounting hole formed therethrough to be mounted to the socket body part.

Preferably, the socket device may further include: a silicone caulking part inserted into an upper open end of the receiving hole and holding an upper end of the spring contact.

Preferably, the socket device may further include: an upper guide plate provided on an upper surface of the upper film plate and having a guide hole formed therethrough such that the guide hole has a size larger than the receiving hole and corresponds to the receiving hole.

Preferably, the socket device may further include: a lower guide plate provided on a lower surface of the lower film plate and having a movement hole formed therethrough such that the movement hole has a size larger than the receiving hole and corresponds to the receiving hole.

The contact pin for testing the semiconductor IC of the present disclosure allows the entire length (about 1.0 mm or less) of the spring contact to be minimized and the maximum compression length of the spring contact to be increased such that a contact force of the spring contact with the terminals of the semiconductor IC can be increased, thereby making the spring contact suitable for testing the semiconductor IC for a high speed signal and increasing the service life of the spring contact.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
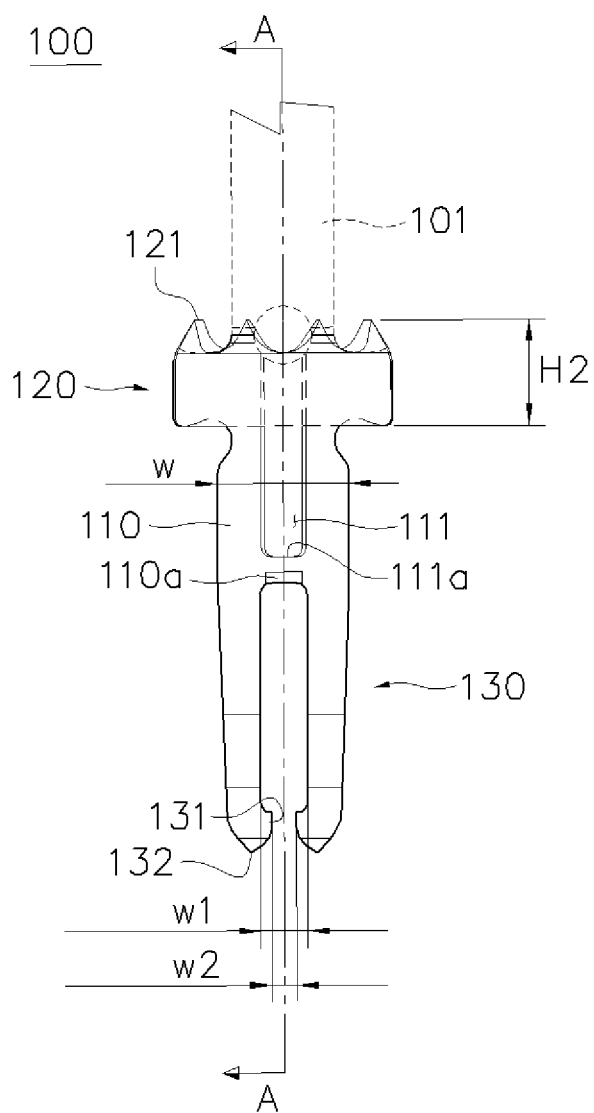
FIG. 1 is a front view of a contact pin according to a first embodiment of the present disclosure.

Unless otherwise defined, terms or words used in the specification and claims are not limited to meanings that are commonly understood or are defined in dictionaries, and should be interpreted as having meanings and concepts that are consistent with the context of the present disclosure, based on the principle that an inventor may properly define concepts of words so as to describe his or her invention in the best mode.

Accordingly, since the exemplary embodiments of the present disclosure and configurations of the drawings have been disclosed for illustrative purposes and do not represent all of the technological spirit of the present disclosure, those skilled in the art will appreciate that various modifications, additions and substitutions are possible without departing from the scope and spirit of the invention as disclosed in the accompanying claims.

In the present disclosure, terms such as "first", "second", and "third" are used interchangeably to distinguish one component from other components, and do not imply the position or importance of individual components. In addition, terms related to the directions such as top, bottom, left, and right used in the present disclosure are intended to represent the relationship between components with reference to the accompanying drawings, and are not intended to absolutely indicate the actual position of each component.

Hereinafter, the embodiments of the present disclosure will be described in detail with reference to the accompanying drawings. For multiple identical components, a reference numeral is indicated for only one component, and an identified reference numeral is used only when a separately identified explanation is required.

Figure 2A:
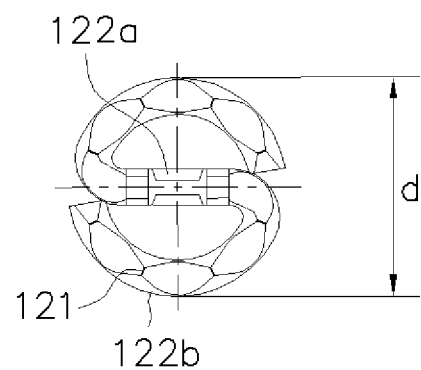
FIGS. 2A and 2B are a top plan view of the contact pin and a sectional view taken along line A-A of FIG. 1, respectively, according to the first embodiment of the present disclosure.
Figure 2B:
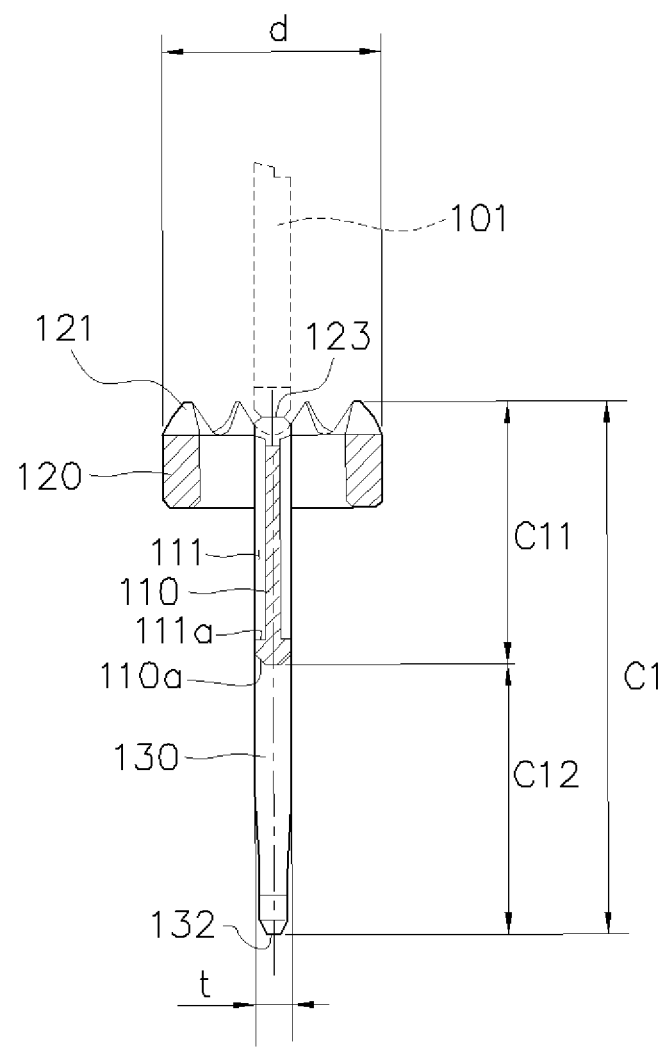

FIG. 1 is a front view of a contact pin according to a first embodiment of the present disclosure;

FIGS. 2A and 2B are a top plan view of the contact pin and a sectional view taken along line A-A of FIG. 1, respectively, according to the first embodiment of the present disclosure.

Referring to FIGS. 1, 2A, and 2B, the contact pin 100 of the embodiment includes a body part 110, a head part 120, and leg parts 130.

The body part 110 has a groove 111 formed at a center of each of opposite surfaces of the body part 110 by being recessed in a longitudinal direction thereof, the groove 111 having predetermined width and length, wherein a stepped holding step 111a is formed at a lower end part of the groove 111 and an upper end of the groove 111 is formed by extending up to an upper end of the head part 120. Preferably, the body part 110 has a chamfered inclined surface 110a having inclination formed in a thickness direction thereof on each edge of the lower end of the body part 110 adjacent to an area between each of the leg parts 130, so in the process in which the two contact pins are assembled with each other by intersecting with each other, the assembling thereof can be easily performed.

The head part 120 is composed of plate-shaped strips 122a and 122b provided on the upper end of the body part 110, each of the strips having the same length at the opposite sides of the center of the body part 110 relative thereto and having an upper tip part 121 formed along the upper end of the strip. The strips 122a and 122b include a first strip section 122a provided to be located on the same plane as a plane of the body part 110 and to have the same length from the center of the body part 110 to each of the opposite sides thereof; and a second strip section 122b formed by being rolled at each of the opposite end parts of the first strip section 122a to have a semicircular shape, wherein the first strip section 122a is located in a diameter direction of a cylindrical shape formed by the entirety of the second strip sections 122b.

The leg part 130 is configured as a pair of leg parts formed by extending from the body part 110 to be horizontally symmetrical to each other with a first width w1 between the leg parts. Each of the leg parts 130 includes a hook protrusion 131 formed by protruding inward from each of end parts of the leg parts, wherein the hook protrusions have a second width w2 therebetween smaller than the first width w1 and face each other. Preferably, the first width w1 between the two leg parts 130 is larger than the thickness t of the body part 110. Accordingly, during the use of a spring contact with the two contact pins combined with each other, sliding friction between the two contact pins is prevented.

Particularly, as illustrated in FIG. 2B, preferably, the length C12 of the leg part 130 including the lower tip part 132 is at least the same as or longer than length C11 from the upper tip part 121 to the lower end of the body part 110 (C11≤C12).

The contact pin 100 having such a configuration is manufactured by stamping a ribbon-shaped plate having predetermined thickness t and width w. Specifically, by punching out a plate, a reel-type contact pin is produced, and together with heat treatment, gold or PdCo plating is applied to the reel-type contact pin according to required characteristics, and then the reel-type contact pin is assembled with a spring to manufacture the spring contact.

Preferably, the contact pin 100 includes a connection tap 123 formed on the upper end of the first strip section 122a such that the connection tap 123 protrudes lower than the upper tip part 121, wherein the connection tap 123 is connected to a carrier strip 101 during the stamping, and finally, the carrier strip 101 is removed therefrom after the connection tap 123 is assembled with a coil spring. This will be described in detail later in the manufacturing process of the spring contact.

Figure 3A:
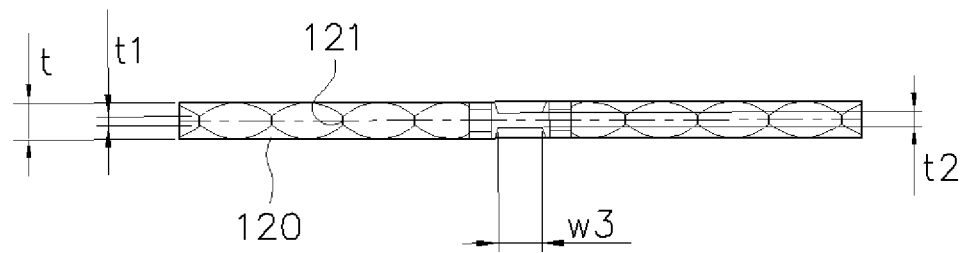
FIGS. 3A and 3B are a top plan view and a front view, respectively, illustrating the unfolded state of the contact pin according to the first embodiment of the present disclosure.
Figure 3B:
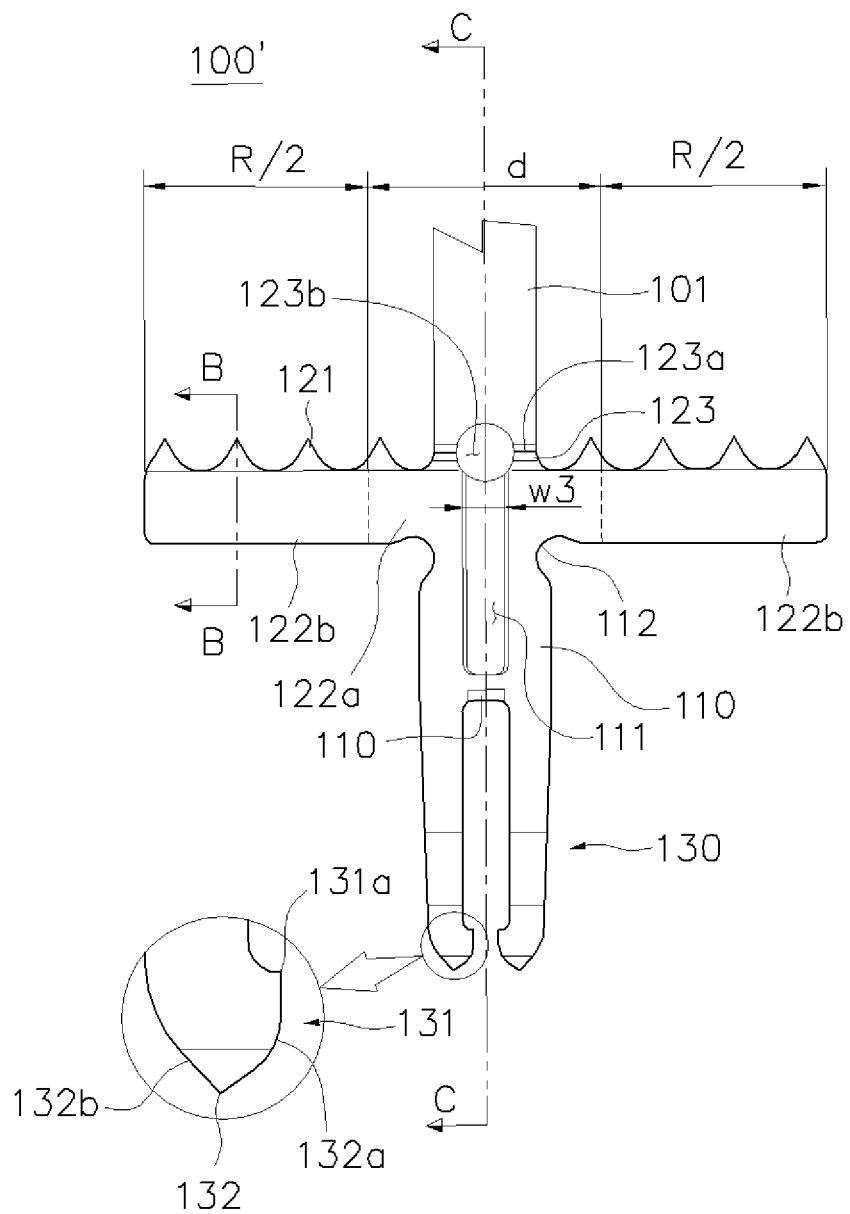
Figure 4A:
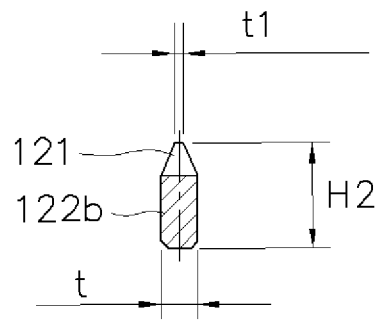
FIGS. 4A and 4B are sectional views taken along lines B-B and C-C of FIG. 3B, respectively.
Figure 4B:
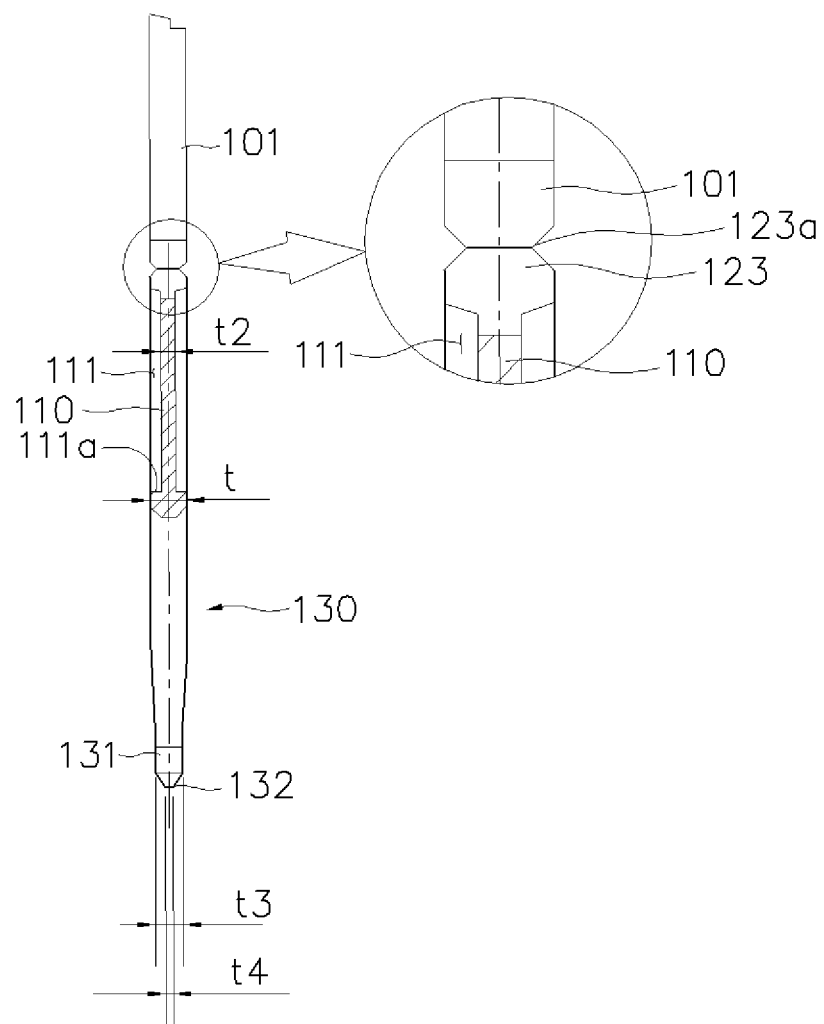

FIGS. 3A and 3B are a top plan view and a front view, respectively, illustrating the unfolded state of the contact pin according to the first embodiment of the present disclosure, and FIGS. 4A and 4B are sectional views taken along lines B-B and C-C of FIG. 3B, respectively.

Referring to FIGS. 3A, 3B, 4A, and 4B, the contact pin 100 includes the strips 122a and 122b provided horizontally to be integrated with the upper part of the body part 110, wherein the upper tip part 121 is provided on the upper end of each of the strips 122a and 122b. Preferably, the thickness t1 of the end of the upper tip part 121 is smaller than the thickness t of the strips 122a and 122b constituting the head part 120 (t1<t). The upper tip part 121 is formed to have the thickness t1 which is small by coining the upper end of each of the strips 122a and 122b, so contact reliability of the upper tip part with the terminal of a semiconductor IC can be improved.

Particularly, referring to FIG. 4A, in the embodiment, the upper tip part 121 is illustrated to have the same inclinations at opposite sides thereof, but the inclinations of the opposite sides may be different from each other. By having the inclinations different from each other at the opposite sides of the upper tip part, the upper tip part 121 may be located to be close to the outer circumference or inner circumference of the head part 120. Alternatively, as a different example, the plurality of upper tip parts may have opposite-side inclinations different from each other, and each of the upper tip parts has inclination different from each other, so the upper tip part is distributed to have a circular plane (two dimension) rather than being distributed to have a circular line (one dimension). Accordingly, contact efficiency of the upper tip part with the terminal of the semiconductor IC can be increased.

The strips 122a and the strips 122b have the same lengths at each of the opposite sides of the center of the body part 110 relative thereto and are manufactured to have a cylindrical shape by rolling the strips 122b, and constitute the head part.

Specifically, the strips 122a and 122b constitute the cylinder-shaped head part including the first strip section 122a located on the same plane as a plane of a body part 310 and provided to have the same length at each of opposite sides of the center of the body part 110; and the second strip section 122b having a semicircular shape by being rolled clockwise (or counterclockwise) at each of the opposite end parts of the first strip section 122a. The head part having such a structure has a shape approximate to an S shape on a plane (see FIG. 2A). Meanwhile, according to the rolling direction of the second strip section 122b, the head part may have an S shape having a horizontally symmetrical shape on a plane.

The first strip section 122a is located in the diameter direction of the head part having a cylindrical shape. Accordingly, the length d of the first strip section 122a corresponds to the diameter of an approximately cylindrical shape, and the sum of the length R/2 of each of the second strip sections 122b provided at opposite ends of the first strip section 122a corresponds to the length R of the circumference of the cylindrical shape of the head part. Accordingly, the relation of the length d of the first strip section 122a and the sum R of the two second strip sections 122b is as follows: R (length of a circumference of a cylinder)=d (diameter of a circle)×π.

The body part 110 has the groove 111 formed longitudinally at each of the opposite surfaces thereof and having predetermined width w3 and depth. The thickness t2 of the body part located in a section in which the groove 111 is formed is smaller than the thickness t of the body part 110 (t2<t). Particularly, the upper end of the groove 111 of the body part 110 extends up to the upper end of the first strip section 122a, so the upper end of the groove 111 is open.

Each of the leg parts 130 has the hook protrusion 131 provided at the lower side thereof and the lower tip part 132 provided in a vertical direction on the lower end thereof, Preferably, the lower tip part 132 includes an edge line formed by two different inclined surfaces in contact with each other. In the embodiment, relative to the lower tip part 132, an inner inclined surface 132a and an outer inclined surface 132b are illustrated to be in contact with each other to form the edge line of the end of the lower tip part 132. In this case, it should be understood that each of the inclined surfaces may be a curved surface having a predetermined curvature or include any inclined surface having inclination of a predetermined angle. Meanwhile, the inner inclined surface 132a defines the hook protrusion 131. The hook protrusion 131 includes an inflection end 131a at which the inflection of the inner inclined surface 132a occurs, wherein the inflection end 131a functions as a hook restricting the vertical movements of the two contact pins.

Preferably, the thickness t3 of the hook protrusion 131 is smaller than the thickness t of the body part 110, and more preferably, the thickness t4 of the lower tip part 132 is smaller than the thickness t3 of the hook protrusion 131 (t4<t3<t). The thickness t4 of the lower tip part 132 is made to be thin by coining the lower end of the hook protrusion 131, so the contact reliability of the lower tip part 132 with the terminal of the semiconductor IC can be improved.

In addition, a width w2 between the hook protrusions 131 of the leg parts 130 is smaller than the thickness t of the body part 110, and is the same as or larger than the thickness t2 of the body part 110 located in a section in which the groove 111 is formed (t2≤w2<t)

As described above, the contact pin 100 further includes the connection tap 123 formed on the upper end of the first strip section 122a such that the connection tap 123 protrudes lower than the upper tip part 121. The connection tap 123 is integrally connected to the carrier strip 101, and has a V-shaped groove 123a formed horizontally in a thickness direction of the carrier strip, so the carrier strip 101 and the contact pin 100 can be easily separated from each other.

Preferably, a through hole 123b may be formed in the contact pin such that the V-shaped groove 123a is formed between the connection tap 123 and the carrier strip 101. The connection tap 123 may be configured as a pair of connection taps provided at opposite sides of the through hole 123b relative thereto. Meanwhile, when the connection tap 123 and the carrier strip 101 are separated from each other, the connection tap 123 which finally protrudes may be configured as the pair of connection taps provided at the opposite sides of the through hole 123b which is concave relative thereto.

Preferably, a recessed joint 112 may be formed concavely inward at each of opposite corners at which the body part 110 and the head part 120 are in contact with each other. Such a recessed joint 112 allows the second strip section 122b to be easily rolled to have a semicircular shape such that the head part is made.

The contact pin 100 having such a configuration is used as the spring contact by being configured as a pair of contact pins, or by being combined as a pair with a different kind of a contact pin, so the length of the spring contact can be manufactured to be about 1.0 mm or less, and a maximum compression distance (a full stroke) of the spring contact can be maximized.

Figure 5A:
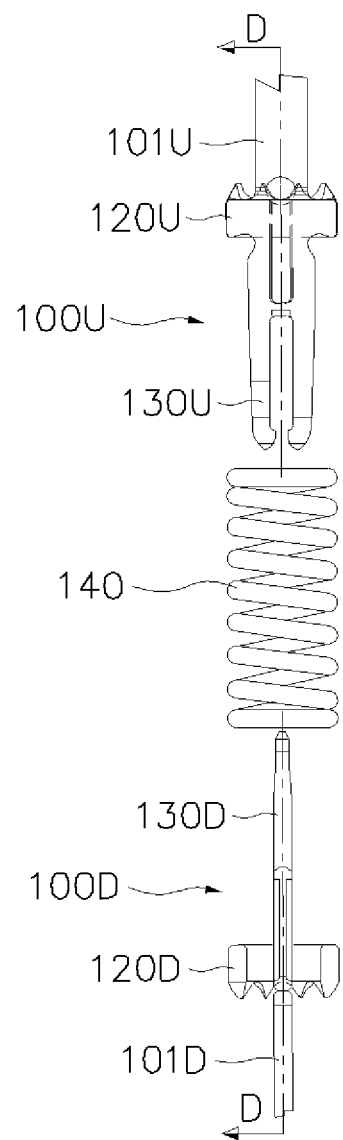
FIGS. 5A, 5B, and 5C are views briefly illustrating the process of manufacturing a spring contact by using the contact pin according to the first embodiment of the present disclosure.
Figure 5B:
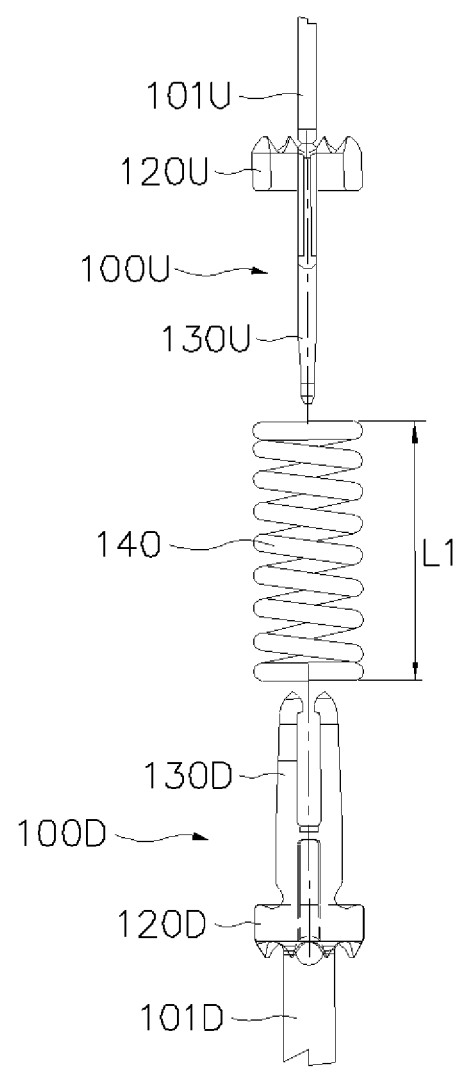
Figure 5C:
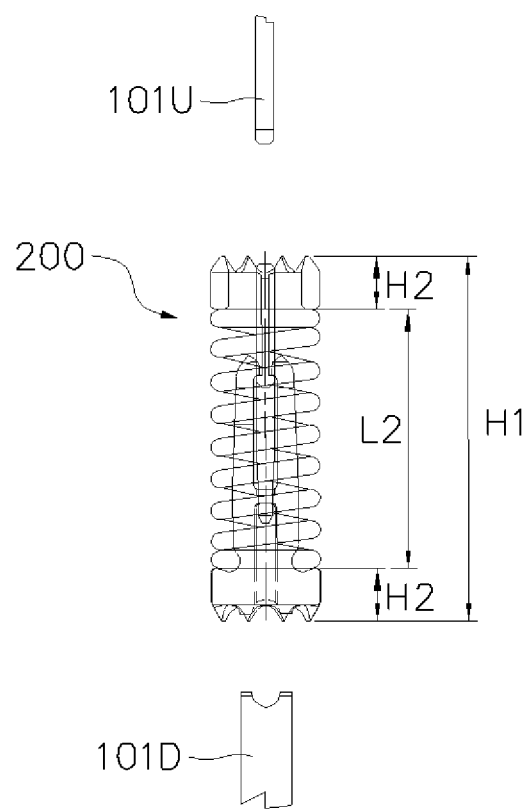

FIGS. 5A, 5B, and 5C are views briefly illustrating the process of manufacturing a spring contact by using the contact pin according to the first embodiment of the present disclosure. FIG. 5A is a view illustrating a state of the spring contact prior to the assembling thereof; FIG. 5B is a sectional view taken along line D-D of FIG. 5A; and FIG. 5C is a view illustrating a state of the spring contact after the assembling thereof. The process of manufacturing the spring contact by configuring the contact pin 100 of the previous embodiment as a pair of contact pins is illustrated. In the following description, the reference numeral of each component is the same as the reference numeral of each component of the previous embodiment, and in order to distinguish a first contact pin 100U and a second contact pin 100D from each other, "U" or "D" is written at the end of each reference numeral of the contact pin 100.

Referring to FIGS. 5A, 5B, and 5C, in the pre-assembly stage of the spring contact 200, the first contact pin 100U and the second contact pin 100D are connected to a first carrier strip 101U and a second carrier strip 101D, respectively, and a first head part 120U and a second head part 120D are rolled and are manufactured to have cylindrical shapes.

Next, the first contact pin 100U and the second contact pin 100D are arranged to intersect with each other such that the first contact pin 100U and the second contact pin 100D are orthogonal to each other, and with the coil spring 140 arranged between the first contact pin 100U and the second contact pin 100D, a first leg part 130U and a second leg part 130D are fitted into the coil spring 140 to be assembled with each other.

A reference numeral L1 refers to the natural length of the coil spring 140 which is in an uncompressed state.

After the first contact pin 100U is assembled with the second contact pin 100D, the carrier strips 101U and 101D of each of the contact pins 100U and 100D are removed from the contact pins 100U and 100D, respectively.

The spring contact 200 manufactured in this way has an entire length H1 obtained by summing the heights (H2×2) of two head parts in the uncompressed state and the height L2 of the coil spring 140 after the assembling of the spring contact 200.

FIGS. 6A, 6B, 6C, and 6D are views briefly illustrating the process of manufacturing the spring contact with the coil spring excluded by using the contact pin according to the first embodiment of the present disclosure.

Referring to FIGS. 6A, 6B, 6C, and 6D, the first contact pin 100U and the second contact pin 100D have the same heights C1. When the first leg part 130U and the second leg part 130D are fitted to each other while intersecting orthogonally with each other, a first hook protrusion 131U is assembled with a second groove 111U of the second contact pin 100D therealong, and likewise, a second hook protrusion 131D is also assembled with a first groove 111D of the first contact pin 100U therealong. Meanwhile, in the process of the vertical movements of the first contact pin 100U and a second contact pin 100D, the hook protrusions 131U and 131D are in contact with the bottom surfaces of the corresponding grooves 111U and 111D, respectively, into which the hook protrusions 131U and 131D are inserted, so the first contact pin 100U and the second contact pin 100D are electrically connected to each other.

Figure 6A:
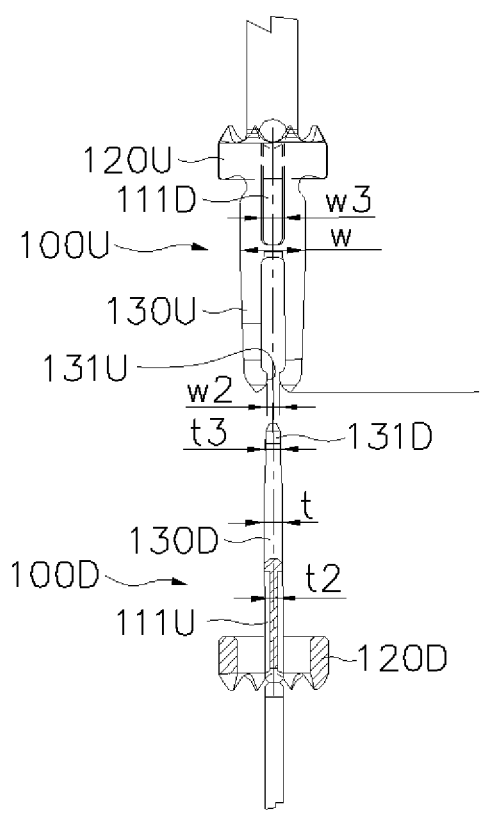
FIGS. 6A, 6B, 6C, and 6D are views briefly illustrating the process of manufacturing the spring contact with a coil spring excluded by using the contact pin according to the first embodiment of the present disclosure.
Figure 6B:
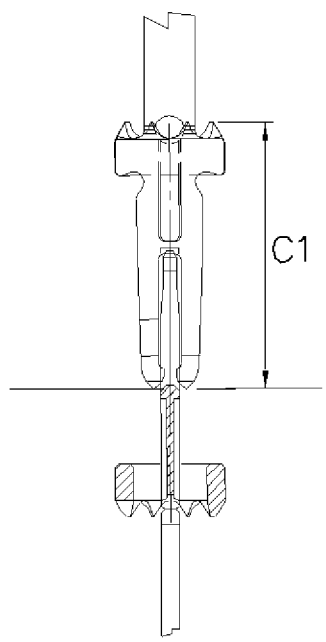
Figure 6C:
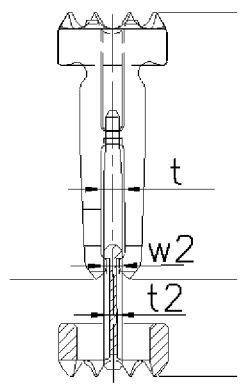
Figure 6D:
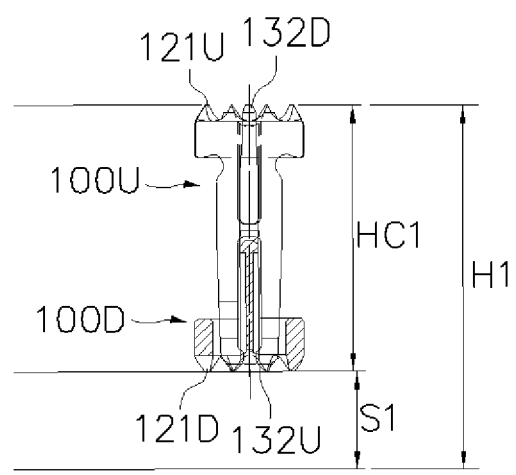

FIG. 6D illustrates the spring contact embodying a maximum compression distance S1 composed of the first contact pin 100U and the second contact pin 100D. As illustrated in FIG. 6D, each groove 111 (see FIG. 3B) of the first contact pin 100U and the second contact pin 100D is open at an upper end thereof. As for the maximum compression distance S1 in the process of compressing each of the contact pins 110U and 110D, a second lower tip part 132D of the second contact pin 100D can be compressed up to a position of a first upper tip part 121U of the first contact pin 100U. In the same manner, a first lower tip part 132U of the first contact pin 100U can be compressed up to a position of a second upper tip part 121D of the second contact pin 100D.

The length (height) HC1 of the spring contact embodying the maximum compression distance S1 is obtained by subtracting the maximum compression distance S1 from the length H1 of the spring contact in the uncompressed state.

Figure 7A:
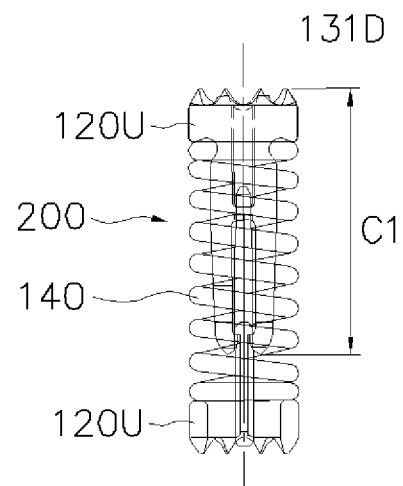
FIGS. 7A, 7B, 7C, 7D, and 7E are views illustrating the spring contact according to the first embodiment of the present disclosure.
Figure 7B:
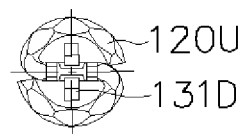
Figure 7C:
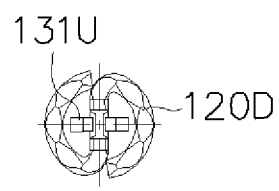
Figure 7D:
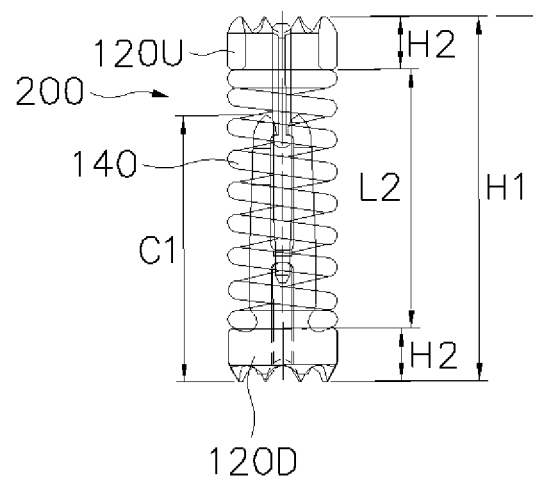
Figure 7E:
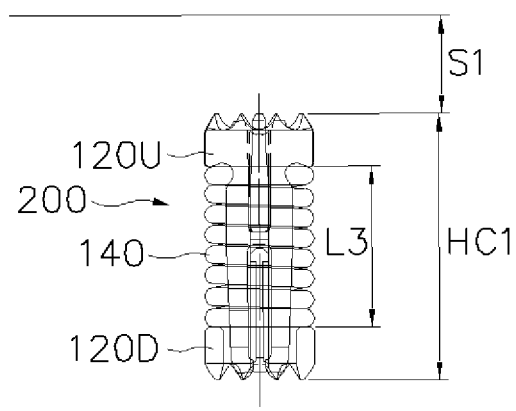

FIGS. 7A, 7B, 7C, 7D, and 7E are views illustrating the spring contact according to the first embodiment of the present disclosure. FIG. 7A is a front view of the spring contact 200; FIGS. 7B and 7C are top plan views shown from the upper and lower sides, respectively, of the spring contact 200; and FIGS. 7D and 7E illustrate the uncompressed and compressed states of the spring contact 200, respectively, in comparison with each other.

In the uncompressed state, the spring contact 200 is configured to have the entire length H1 which is the sum of the assembly length L2 of the coil spring 140 and the entire length (H2×2) of the first head part 120U and the second head part 120D, thereby minimizing the entire length (height) of the spring contact 200 and obtaining the maximum compression distance S1.

To minimize the entire length H1 of the spring contact 200, the length H2 of each of the first head part 120U and the second head part 120D may be decreased. For example, when the spring contact is manufactured to have the entire length H1 thereof which is about 1.0 mm, the length H2 of each of the head parts may be about 0.15 mm. Preferably, the natural length L1 of the coil spring 140 is larger than or at least the same as the length L2 of the coil spring 140 in the uncompressed state after the assembling of the spring contact.

Such a spring contact 200 can be manufactured to have the length of about 1.0 mm or less, so compared to a contact of a conventional technology, the spring contact 200 can have significantly shorter length and make the maximum compression distance S1 longer. The present inventor checked that the spring contact can obtain the maximum compression distance S1 of about 0.25 mm~0.3 mm and embody an elastic force of about 15 gf~30 gf/pin when the spring contact having an initial length of 1.0 mm according to the embodiment is manufactured.

The spring contact having such characteristics is particularly very useful for testing devices for high speed signals, and the service life of the spring contact can be increased.

Figure 8:
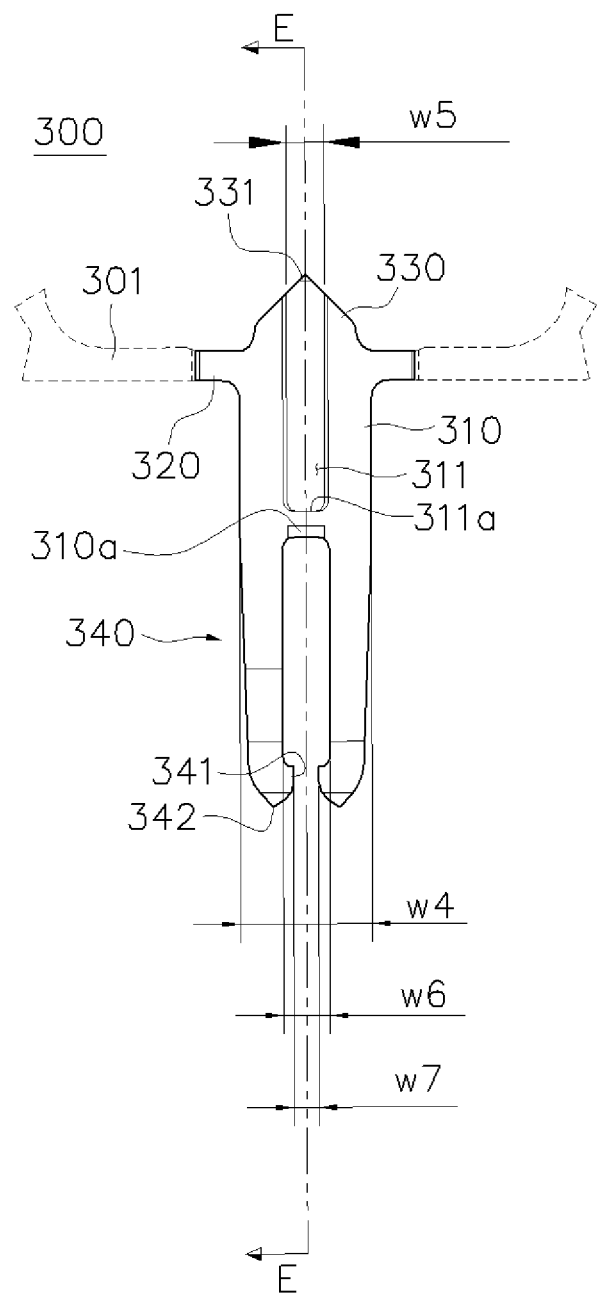
FIG. 8 is a front view of a contact pin according to a second embodiment of the present disclosure.
Figure 9A:
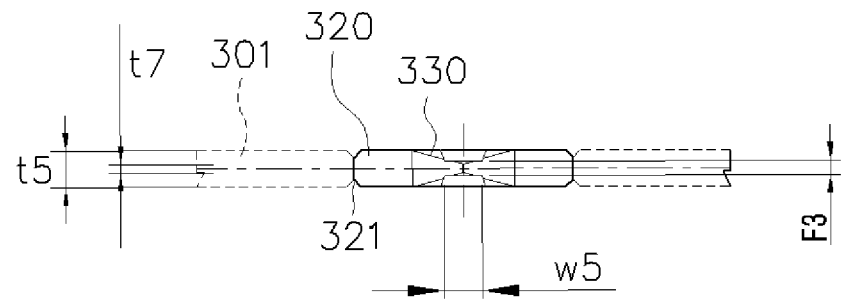
FIGS. 9A and 9B are a top plan view of the contact pin of FIG. 8 and a sectional view taken along line E-E of FIG. 8, respectively.
Figure 9B:
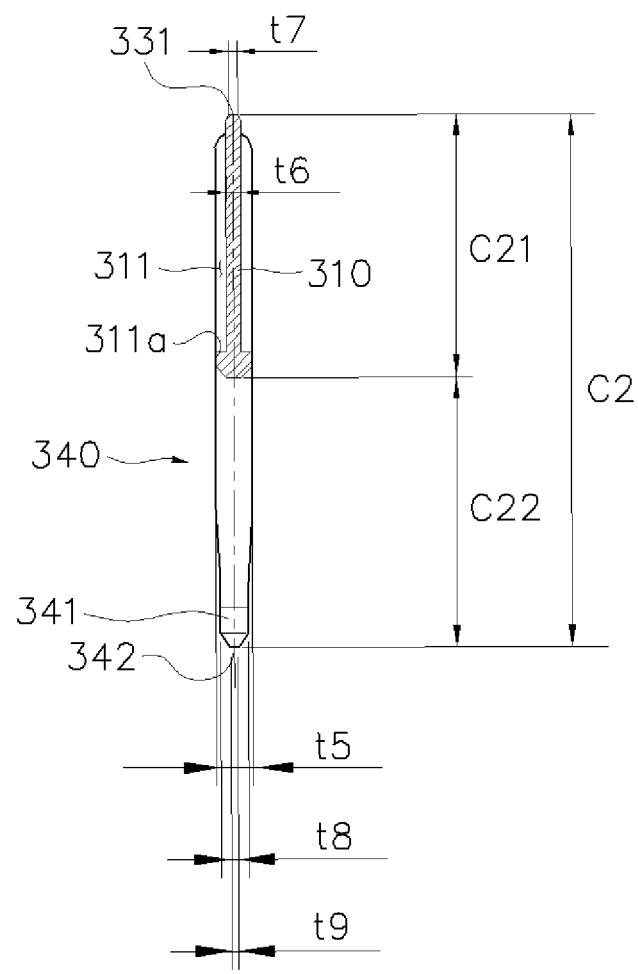

FIG. 8 is a front view of a contact pin according to a second embodiment of the present disclosure, and FIGS. 9A and 9B are a top plan view of the contact pin of FIG. 8 and a sectional view taken along line E-E of FIG. 8, respectively;

Referring to FIGS. 8, 9A, and 9B, the contact pin 300 of the embodiment has a plate-shaped structure having predetermined length C2, width w4, and thickness t5, and includes: a body part 310 having a groove 311 formed at each of opposite surfaces of the body part 310 by being recessed in a longitudinal direction thereof; a shoulder part 320 formed by protruding from each of opposite side ends of the body part 310; a head part 330 having an upper tip part 331 protruding upward therefrom and formed to be integrated with the upper end of the body part 310; and a pair of leg parts 340 formed by extending from the lower end of the body part 310 to be integrated therewith such that the leg parts are horizontally symmetrical to each other.

The body part 310 has the groove 311 formed at each of the opposite surfaces of the body part 310 by being recessed in the longitudinal direction thereof along the central axis of the body part 310, the groove 311 having predetermined width w5 and depth. The upper end of the groove 311 passes through the head part 330 and is open to the upper end of the head part 330. However, the lower end of the groove 311 has a stepped holding step 311a. The body part 310 has a predetermined thickness t5 as a whole, and the section of the body part 310 in which the groove 311 is formed is formed to be recessed, so thickness t6 of the body part 310 having the recessed section is smaller than the thickness t5 of the body part 310 (t6<t5).

The body part 310 is provided with a pair of shoulder parts 320 formed by protruding and extending from opposite ends thereof, and each of the shoulder parts 320 functions to support the coil spring. Preferably, the shoulder part 320 is connected to a carrier strip 301 during the stamping, and finally, the carrier strip 301 is removed therefrom after the shoulder part 320 is assembled with the coil spring as described in the previous embodiment. A V-shaped groove 321 is formed between the shoulder part 320 and the carrier strip 301 in a thickness direction of the shoulder part 320, so after the shoulder part 320 is assembled with the coil spring, the carrier strip 301 and the contact pin 300 can be easily separated from each other.

The head part 330 is provided with the upper tip part 331 protruding upward therefrom and is configured to be integrated with the upper end of the body part 310. Preferably, the thickness t7 of the end of the upper tip part 331 is smaller than the thickness t6 of the body part 310 located in the section in which the groove 311 is formed (t7<t6). The thickness t7 of the upper tip part 331 is made to be thin by coining the upper end of the head part 330, so the contact reliability of the upper tip part 331 with the terminal of the semiconductor IC can be improved.

Meanwhile, in the embodiment, one tip part pointedly protruding from the upper end of the head part 330 is illustrated, but the upper tip part may be configured as a plurality of tip parts.

A leg part 340 is configured as a pair of leg parts formed at the lower end of the body part 310 such that the leg parts are horizontally symmetrical to each other by being spaced apart by a predetermined width w6 from each other. The lower end parts of the leg parts 340 protrude inward and have a predetermined width w7 therebetween. The leg parts 340 include hook protrusions 341 facing each other, respectively, at the lower end parts thereof and lower tip parts 342 at lowest ends thereof, respectively (w7<w6).

Preferably, the width w6 between the two leg parts 340 is larger than the thickness t5 of the body part 340. Accordingly, during the use of the spring contact by combining the two contact pins with each other, sliding friction between the two contact pins can be minimized.

Preferably, the thickness t8 of the hook protrusion 341 is smaller than the thickness t5 of the body part 310, and more preferably, the thickness t9 of the lower tip part 342 is still smaller than the thickness t8 of the hook protrusion 341 (t9<t8<t5). The thickness t9 of the lower tip part 342 is made to be thin by coining the lower end of the hook protrusion 341, so the contact reliability of the lower tip part 342 with the terminal of the semiconductor IC can be improved.

Furthermore, a width w7 between the hook protrusions 341 of the leg parts 340 is smaller than the thickness t5 of the body part 340, and is the same as or larger than the thickness t6 of the body part 310 located in a section in which the groove 311 is formed (t6≤w7<t5).

Preferably, length C22 of the leg part 340 including the lower tip part 342 is at least the same as or longer than length C21 from the upper tip part 331 to the lower end of the body part 310 (C21≤C22).

The contact pin 300 having such a configuration according to the embodiment may be combined with the contact pin of the previous embodiment to be used as the spring contact.

Figure 10:
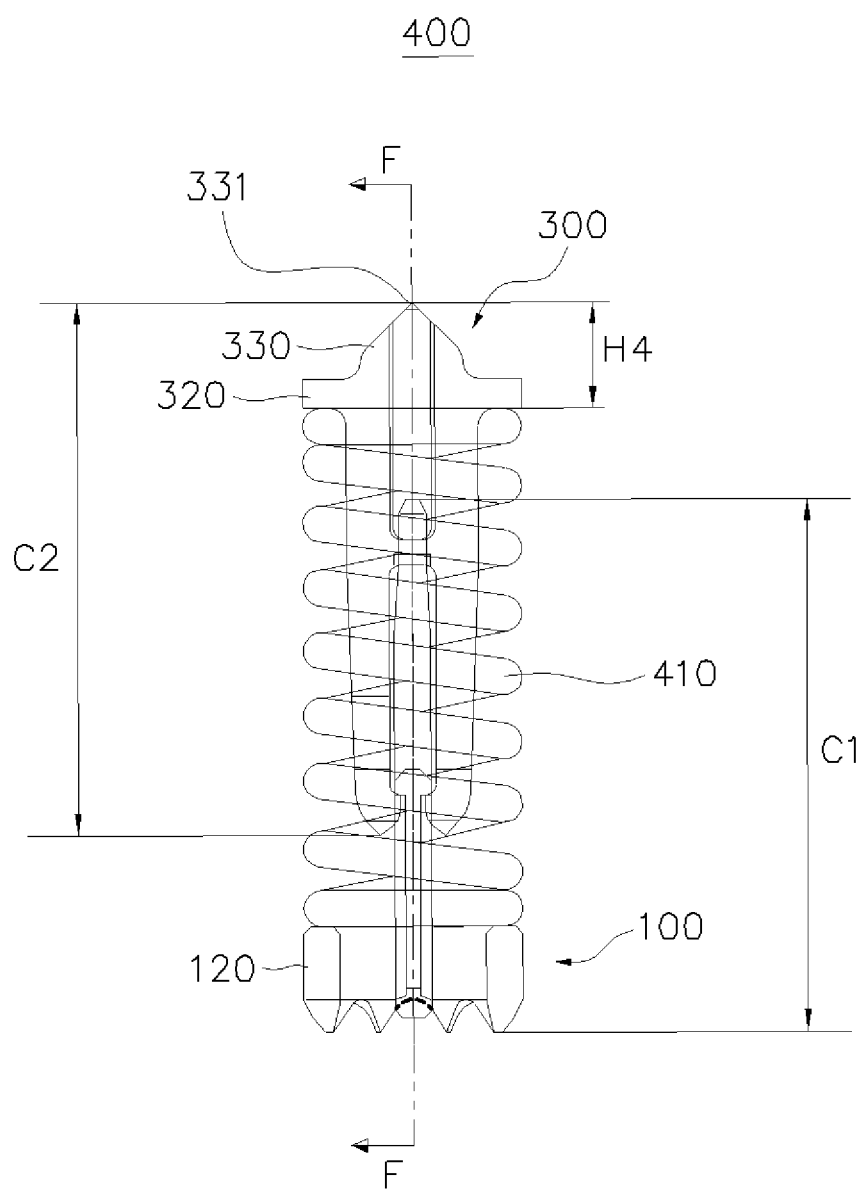
FIG. 10 is a front view of a spring contact according to the second embodiment of the present disclosure.
Figure 11:
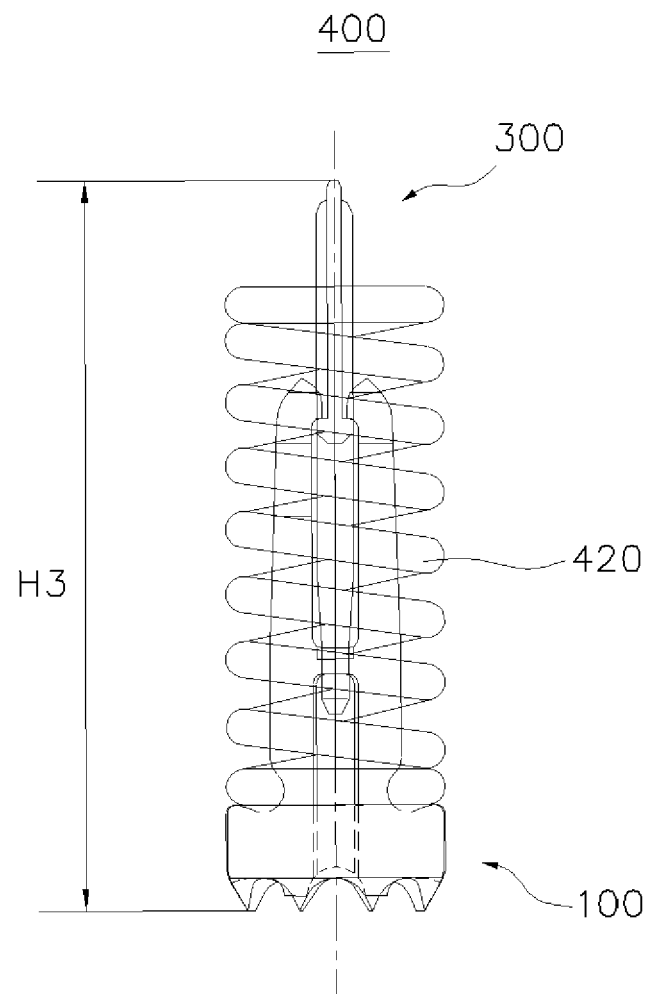
FIG. 11 is a sectional view taken along line F-F of FIG. 10.

FIG. 10 is a front view of the spring contact according to the second embodiment of the present disclosure, and FIG. 11 is a sectional view taken along line F-F of FIG. 10.

Referring to FIGS. 10 and 11, the spring contact 400 of the embodiment is a spring contact combined with the contact pins described above, and includes: a first contact pin 100 having a cylinder-shaped first head part 120; a second contact pin 300 having a plate-shaped second head part 330; and the coil spring 410 elastically supporting the first contact pin 100 and the second contact pin 300.

The first contact pin 100 is the same as the contact pin of the first embodiment, and the second contact pin 300 is the same as the contact pin of the second embodiment. The coil spring 410 is supported between the first head part 120 of the first contact pin 100 and the shoulder part 320 of the second contact pin 300 and elastically supports the first contact pin 100 and the second contact pin 300.

The length C1 of the first contact pin 100 is the same as the length C2 of the second contact pin 300 (C1=C2). In the spring contact 400 having such a configuration, the entire length (height) H3 of the spring contact 400 can be minimized and the maximum compression distance can be achieved as described the previous embodiment (see FIG. 7). For reference, in the second contact pin 300, length H4 of a part determining the entire length H3 of the spring contact 400 and corresponding to the first head part 120 of the first contact pin 100 corresponds to length from the upper tip part 331 to the lower end of the shoulder part 320.

Figure 12:
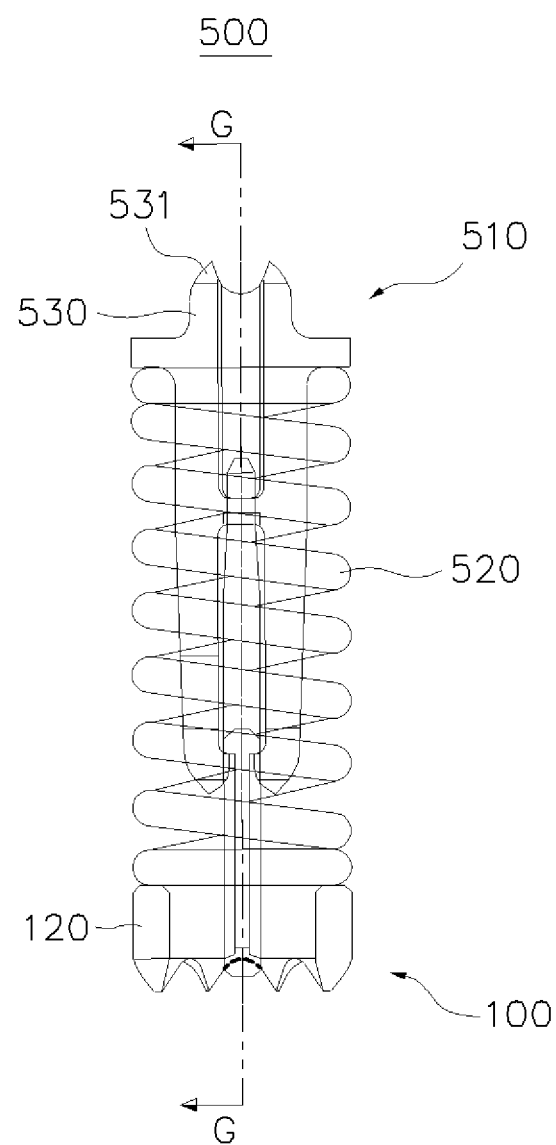
FIG. 12 is a front view of a spring contact according to a third embodiment of the present disclosure.
Figure 13:
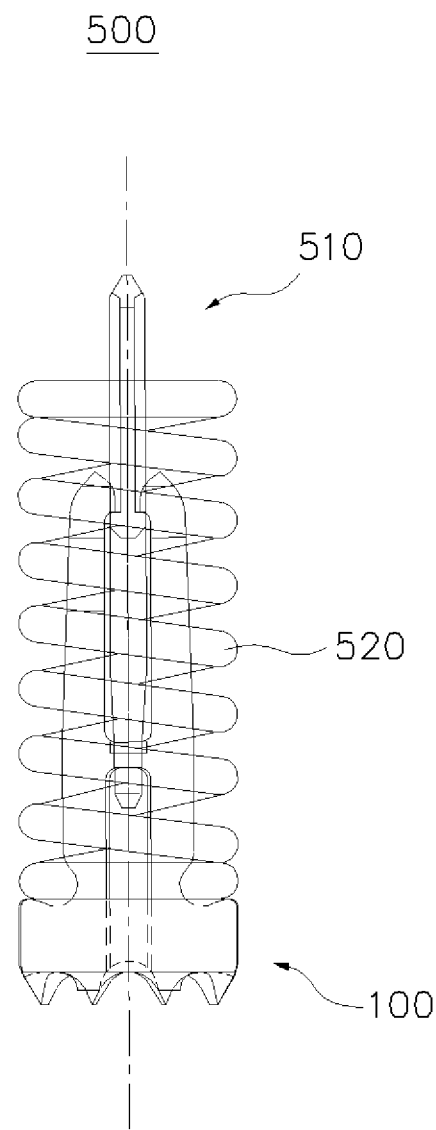
FIG. 13 is a sectional view taken along line G-G of FIG. 12.

FIG. 12 is a front view of a spring contact according to a third embodiment of the present disclosure, and FIG. 13 is a sectional view taken along line G-G of FIG. 12;

Referring to FIGS. 12 and 13, a spring contact 500 of the third embodiment as another modified embodiment of the spring contact of the second embodiment includes: the first contact pin 100 having the first head part 120 having a cylindrical shape; a second contact pin 510 having a plate-shaped second head part 530; and a coil spring 520 elastically supporting the first contact pin 100 and the second contact pin 510.

Such a spring contact 500 is substantially the same as the spring contact of the second embodiment, but the second contact pin 510 includes a head part 530 having a pair of upper tip parts 531 horizontally symmetrical to each other. The number and shape of the upper tip parts 531 formed to be integrated with the head part 530 of the second contact pin 510 may be variously modified to improve the contact of the spring contact 500 with the terminal of the semiconductor IC.

Figure 14:
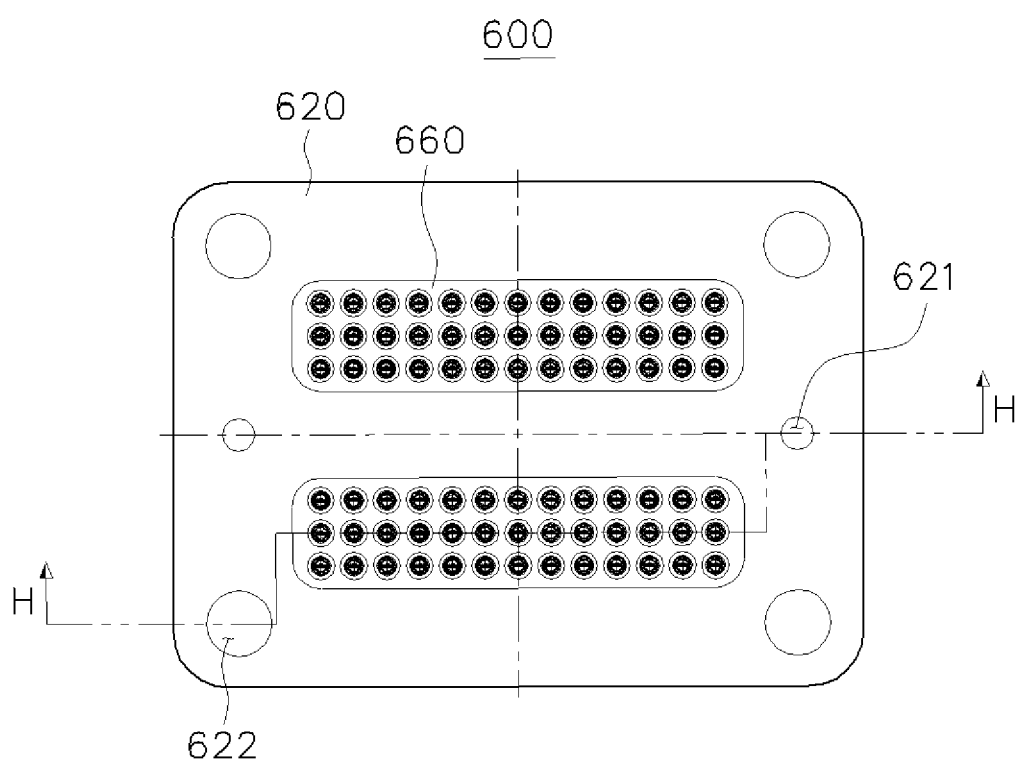
FIG. 14 is a top plan view of a socket device according to the embodiments of the present disclosure.
Figure 15:
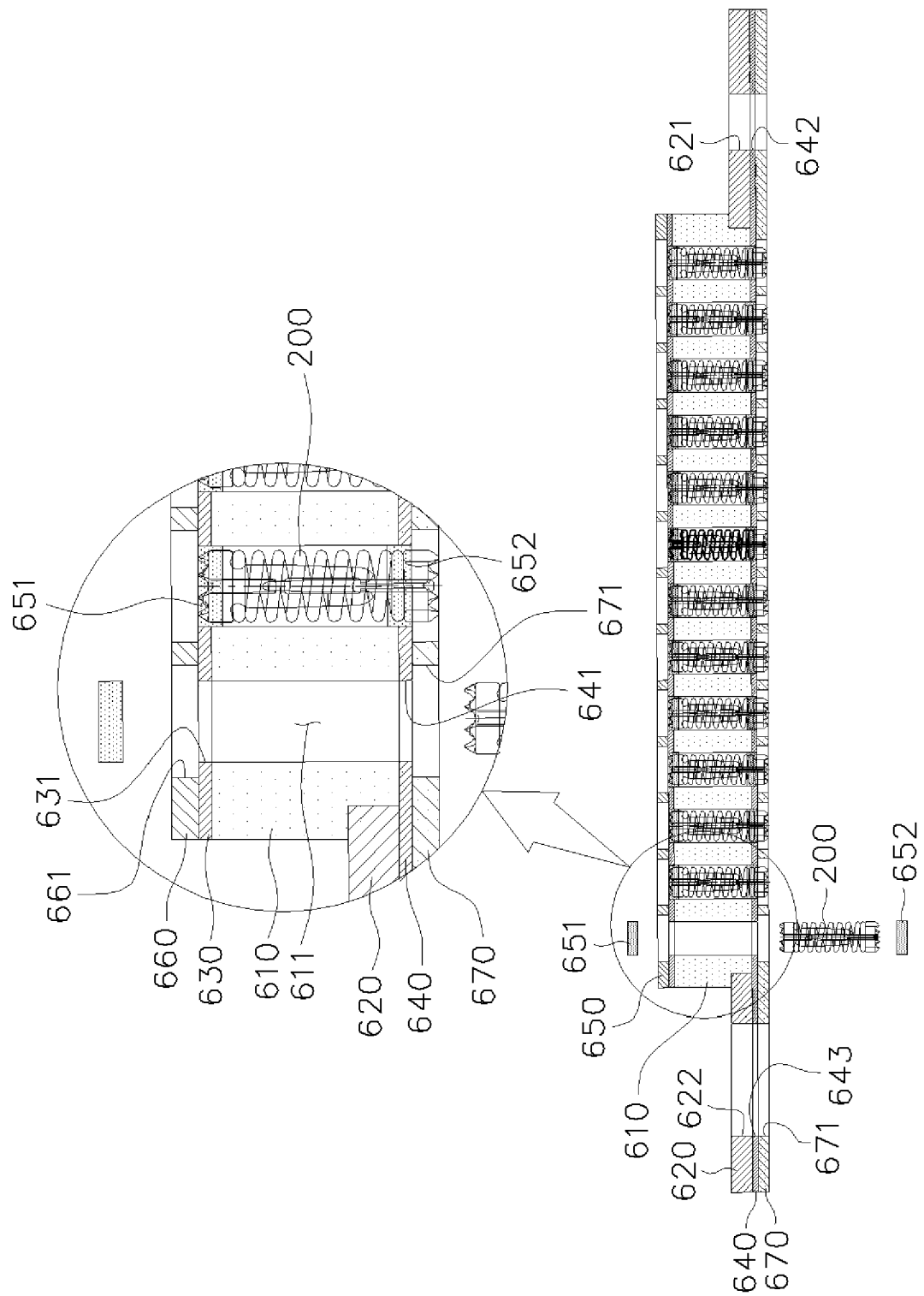
FIGS. 15 and 16 are sectional views taken along line H-H of FIG. 14.
Figure 16:
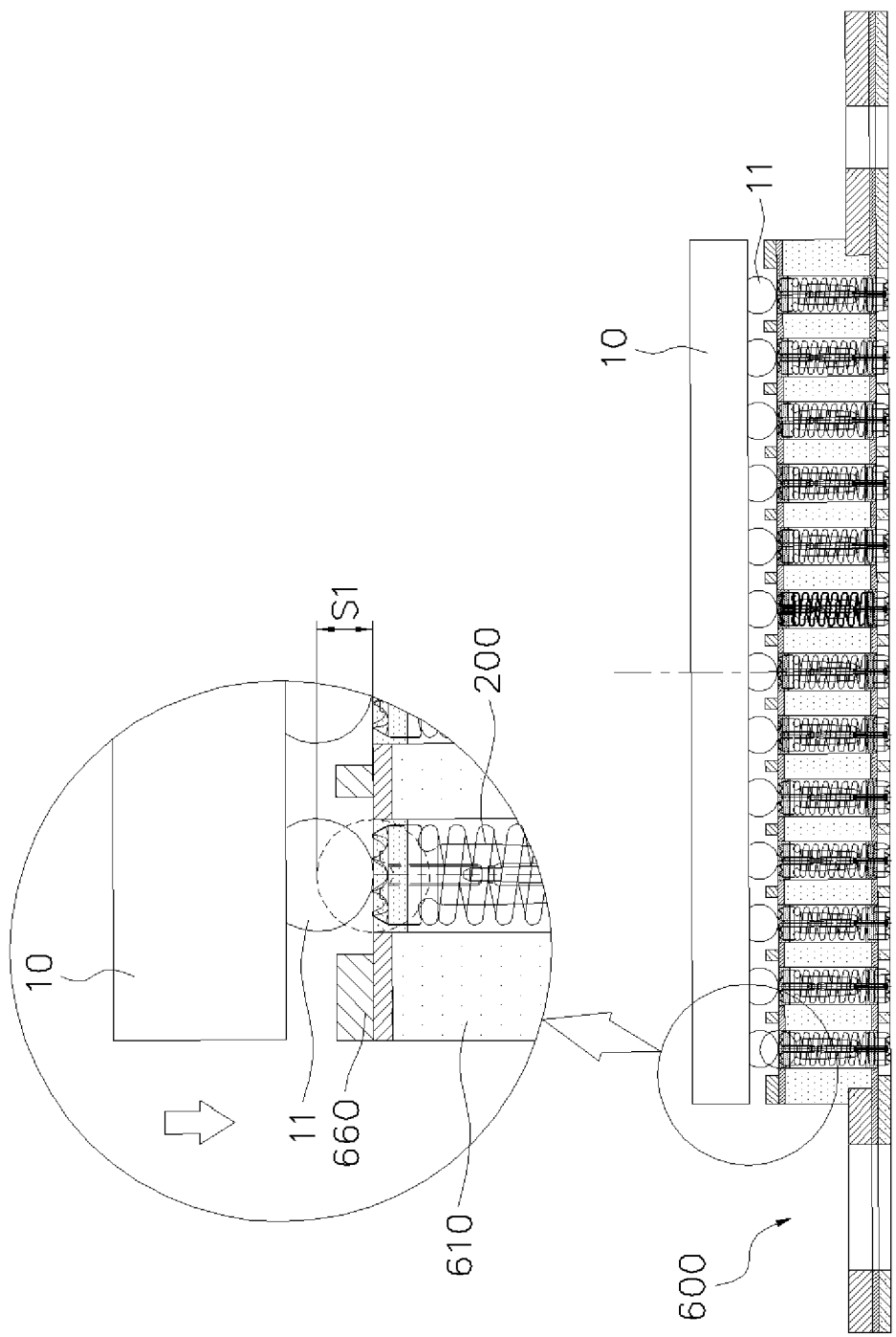

FIG. 14 is a top plan view of a socket device according to the embodiments of the present disclosure; FIGS. 15 and 16 are sectional views taken along line H-H of FIG. 14. FIG. 18 illustrates the socket device in which the semiconductor IC is seated. For reference, in the following description, the spring contact 200 is described as the spring contact of the first embodiment described above, but is not limited thereto.

Referring to FIGS. 14 and 15, the socket device 600 of the embodiment includes: an elastic socket body part 610 having a receiving hole 611 formed therethrough, the receiving hole allowing the spring contact 200 to be inserted therethrough and to be received therein; a mounting plate 620 mounted to the socket body part 610 and having a mounting guide hole 621 formed therethrough such that the mounting plate 620 is mounted to a precise position of the socket body part 610; an elastic upper film plate 630 having a first through hole 631 formed therethrough and attached to the upper surface of the socket body part 610, wherein the first through hole corresponds to the receiving hole 611; and a lower film plate 640 attached to the lower side of the mounting plate 620 and having a second through hole 641 and a third through hole 642 formed therethrough, the second through hole 641 and the third through hole 642 corresponding to the receiving hole 611 and the mounting guide hole 621, respectively.

The socket body part 610 has a plurality of receiving holes 611 formed therethrough such that each of the receiving holes 611 receives the spring contact 200 disposed by corresponding to the terminal of the semiconductor IC. The socket body part 610 may be made of an elastic material to be easily transformed elastically in a vertical direction. Such a socket body part 610 may be made of electrically insulating elastic silicone, but is not limited thereto.

The mounting plate 620 mounts the socket body part 610 thereto, and has at least one mounting guide hole 621 formed therethrough such that the mounting plate 620 is mounted to the precise position of the socket body part 610, and may further have a first mounting hole 622 formed therethrough for the mounting of the socket body part 610.

The upper film plate 630 has the first through hole 631 formed therethrough such that the first through hole 631 corresponds to the receiving hole 611. The upper film plate 630 is attached to the upper surface of the socket body part 610 and functions to guide the precise position of the spring contact, and is made of an electrically insulating elastic material.

The lower film plate 640 has the second through hole 641 and the third through hole 642 formed therethrough such that the second through hole 641 and the third through hole 642 correspond to the receiving hole 611 and the mounting guide hole 621, respectively, and is attached to the lower surface of the mounting plate 620. Such a lower film plate 640 may have a second mounting hole 643 formed therethrough such that the second mounting hole 643 corresponds to the first mounting hole 622 when the first mounting hole 622 is formed through the mounting plate 620.

Preferably, the socket device 600 may further include a first silicone caulking part 651 inserted into an upper open end of the receiving hole 611 and holding the upper end of the spring contact. Such a first silicone caulking part 651 holds the spring contact 200 such that the spring contact 200 received into the receiving hole 611 is not removed therefrom, and may be made of elastic silicone rubber. Additionally, a second silicone caulking part 652 is provided in the lower open section of the receiving hole 611 and may hold the lower end of the spring contact 200.

Preferably, an upper guide plate 660 may be provided on the upper surface of the upper film plate 630. The upper guide plate 660 has a guide hole 661 formed therethrough, wherein the guide hole has a size larger than the receiving hole 611 and corresponds to the receiving hole 611. The upper guide plate 660 guides the position of the ball terminal of the semiconductor IC in the process of loading the semiconductor IC. The upper guide plate 660 may be made of an electrically insulating elastic material.

Preferably, a lower guide plate 670 may be provided on the lower surface of the lower film plate 640. The lower guide plate 670 has a movement hole 671 formed therethrough such that the movement hole has a size larger than the receiving hole 611 and corresponds to the receiving hole 611. Such a lower guide plate 670 provides space allowing the socket body part 610 and the lower film plate 640 to be depressed elastically, so the spring contact 200 can be more effectively compressed downward.

As illustrated in FIG. 16, the semiconductor IC 10 sits on the socket device 600, and each ball terminal of the semiconductor IC 10 is located in each guide hole of the upper guide plate 660. When the semiconductor IC 10 is pressed by a pusher (not shown), the ball terminal 11 is in contact with the spring contact 200, and the spring contact 200 is compressed downward. In this case, the spring contact 200 can be compressed by the maximum compression distance S1.

As described above, the contact pin, spring contact including the same, and socket device of the present disclosure are described by limited embodiments and drawings, but are not limited to this and may be modified or changed by those skilled in the art within the spirit of the art of the present disclosure and the range of the claims below.

What is claimed is:

1. A contact pin for a spring contact, the contact pin comprising:
    a plate-shaped body part having a predetermined width and a predetermined thickness;
    a head part configured to be integrated with an upper end of the body part; and
    a leg part formed by extending from a lower end of the body part to be integrated therewith,
    wherein the head part is a plate-shaped strip provided on the upper end of the body part, wherein the strip has the same length at each of opposite sides of the body part relative thereto and has an upper tip part formed along an upper end of the strip, the strip comprising: a first strip section provided to be located on the same plane as a plane of the body part and to have the same distance from a center of the body part to each of the opposite sides thereof, and a second strip section formed by being rolled at each of opposite end parts of the first strip section to have a semicircular shape, wherein the first strip section is located in a diameter direction of a cylindrical shape formed by an entirety of the second strip sections;
    the body part has a groove formed at the center of each of opposite surfaces of the body part by being recessed in a longitudinal direction of the body part, wherein a stepped holding step is formed on a lower end part of the groove, and an upper end of the groove is formed to be open by extending up to an upper end of the first strip section; and
    the leg part is configured as a pair of leg parts formed by extending from the body part such that the leg parts have a first width therebetween and are horizontally symmetrical to each other, wherein each of the leg parts comprises: a hook protrusion formed by protruding inward from each of end parts of the leg parts, the hook protrusions having a second width therebetween smaller than the first width; and a lower tip part formed by protruding from a lower end of the leg part.

2. The contact pin of claim 1, wherein a thickness of an end of the upper tip part is smaller than a thickness of the strip of the head part.

3. The contact pin of claim 1, wherein opposite corners at which the body part and the head part are in contact with each other are formed concavely inward.

4. The contact pin of claim 1, wherein a chamfered inclined surface having an inclination is formed in a thickness direction of the body part on each edge of the lower end of the body part adjacent to an area between the leg parts.

5. The contact pin of claim 1, wherein the hook protrusion has an inclined surface in an opening direction thereof.

6. The contact pin of claim 1, wherein a thickness of the hook protrusion is smaller than the thickness of the body part.

7. The contact pin of claim 1, wherein the lower tip part has a thickness smaller than a thickness of the hook protrusion.

8. The contact pin of claim 1, wherein the first width between the leg parts is larger than the thickness of the body part.

9. The contact pin of claim 1, wherein the second width between the hook protrusions is smaller than the thickness of the body part and is the same as or larger than a thickness of the body part located in a section in which the groove is formed.

10. The contact pin of claim 1, further comprising: a connection tap formed on the upper end of the first strip section such that the connection tap protrudes lower than the upper tip part.

11. The contact pin of claim 10, wherein the connection tap has a through hole formed concavely, and is configured as a pair of connection taps at opposite sides of the through hole relative thereto.

12. A spring contact comprising the contact pin of claim 1 as a first contact pin and a second contact pin, the spring contact comprising:
a coil spring elastically supporting the first contact pin and the second contact pin while a leg part of the first contact pin and a leg part of the second contact pin intersect orthogonally with each other and are supported by a head part of the second contact pin and a head part of the first contact pin, respectively.

13. The spring contact of claim 12, wherein a length of the first contact pin and a length of the second contact pin are the same.

14. The spring contact of claim 12, wherein an entire length of the spring contact is the same as a sum of lengths of the head parts of the first contact pin and the second contact pin and of a length of the coil spring.

15. The spring contact of claim 14, wherein an entire length of the spring contact is the same as a sum of the length of the head part of the first contact pin, a length from a second upper tip part of the second contact pin to a lower end of a shoulder part thereof, and the length of the coil spring.

16. A spring contact comprising the contact pin of claim 1 as a first contact pin, the spring contact comprising:
a coil spring having an end supported by a head part of the first contact pin, and
a second contact pin elastically supported by the coil spring and intersecting orthogonally with the first contact pin,
wherein the second contact pin comprises: a second plate-shaped body part having a predetermined width and a predetermined thickness; a pair of shoulder parts formed by protruding from opposite side ends of the second body part and supporting an end of the coil spring; a second head part having a second upper tip part formed by protruding upward therefrom and configured to be integrated with an upper end of the second body part on the same plane as a plane of the upper end of the body part; and a second leg part formed by extending integrally from a lower end of the second body part and being assembled with a leg part of the first contact pin by intersecting with the leg part of the first contact pin,
wherein the second body part has a second groove formed by being recessed in a longitudinal direction thereof at a center of each of opposite surfaces thereof, wherein a stepped second holding step is formed at a lower end part of the second groove, and an upper end of the second groove is formed to be open by extending up to an upper end of the second head part, and
the second leg part is configured as a pair of second leg parts formed by extending from the body part such that the second leg parts have a first width therebetween and are horizontally symmetrical to each other, wherein each of the second leg parts comprises: a second hook protrusion formed by protruding inward from each of end parts of the second leg parts, the second hook protrusions having a second width therebetween smaller than the first width; and a second lower tip part formed by protruding from a lower end of the second leg part.

17. The spring contact of claim 16, wherein a length of the first contact pin and a length of the second contact pin are the same.

18. A socket device for testing a semiconductor IC, the socket device comprising the spring contact according to claim 12, the socket device comprising:
an elastic socket body part having a receiving hole formed therethrough, the receiving hole allowing the spring contact to be inserted therethrough and to be received therein;
a mounting plate mounted to the socket body part and having a mounting guide hole formed therethrough such that the mounting plate is mounted to a precise position of the socket body part;
an elastic upper film plate having a first through hole formed therethrough and attached to an upper surface of the socket body part, wherein the first through hole corresponds to the receiving hole; and
a lower film plate attached to a lower side of the mounting plate and having a second through hole and a third through hole formed therethrough, the second through hole and the third through hole corresponding to the receiving hole and the mounting guide hole, respectively.

19. The socket device of claim 18, wherein each of the mounting plate and the lower film plate additionally has a mounting hole formed therethrough to be mounted to the socket body part.

20. The socket device of claim 18, further comprising:
a silicone caulking part inserted into an upper open end of the receiving hole and holding an upper end of the spring contact.

21. The socket device of claim 18, further comprising:
an upper guide plate provided on an upper surface of the upper film plate and having a guide hole formed therethrough such that the guide hole has a size larger than the receiving hole and corresponds to the receiving hole.

22. The socket device of claim 18, further comprising:
a lower guide plate provided on a lower surface of the lower film plate and having a movement hole formed therethrough such that the movement hole has a size larger than the receiving hole and corresponds to the receiving hole.

* * * * *